United States Patent
Holme et al.

(10) Patent No.: US 7,790,629 B2
(45) Date of Patent: Sep. 7, 2010

(54) ATOMIC LAYER DEPOSITION OF STRONTIUM OXIDE VIA N-PROPYLTETRAMETHYL CYCLOPENTADIENDYL PRECURSOR

(75) Inventors: Timothy P. Holme, Stanford, CA (US); Friedrich B. Prinz, Woodside, CA (US); Masayuki Sugawara, Palo Alto, CA (US)

(73) Assignees: The Board of Trustees of the Leland Stanford Junior University, Palo Alto, CA (US); Honda Motor Co., Ltd, Tokyo (JP)

( * ) Notice: Subject to any disclaimer, the term of this patent is extended or adjusted under 35 U.S.C. 154(b) by 428 days.

(21) Appl. No.: 12/070,376

(22) Filed: Feb. 14, 2008

(65) Prior Publication Data
US 2008/0242111 A1 Oct. 2, 2008

Related U.S. Application Data

(60) Provisional application No. 60/901,741, filed on Feb. 15, 2007.

(51) Int. Cl.
*H01L 21/31* (2006.01)
(52) U.S. Cl. .................................. 438/778; 257/789
(58) Field of Classification Search ................ 438/778, 438/635, 789, 790
See application file for complete search history.

(56) References Cited

U.S. PATENT DOCUMENTS

| | | | | |
|---|---|---|---|---|
| 5,828,080 A * | 10/1998 | Yano et al. | ..................... | 257/43 |
| 5,972,430 A * | 10/1999 | DiMeo et al. | .......... | 427/255.32 |
| 6,838,293 B2 | 1/2005 | Basceri et al. | | |
| 7,038,284 B2 | 5/2006 | Haukka et al. | | |
| 2007/0018214 A1* | 1/2007 | Ahn et al. | ..................... | 257/295 |
| 2008/0182427 A1* | 7/2008 | Oberbeck et al. | ........... | 438/785 |
| 2008/0274615 A1* | 11/2008 | Vaartstra | ..................... | 438/685 |

* cited by examiner

*Primary Examiner*—Thao Le
(74) *Attorney, Agent, or Firm*—Lumen Patent Firm

(57) ABSTRACT

A method of depositing oxide materials on a substrate is provided. A deposition chamber holds the substrate, where the substrate is at a specified temperature, and the chamber has a chamber pressure and wall temperature. A precursor molecule containing a cation material atom is provided to the chamber, where the precursor has a line temperature and a source temperature. An oxidant is provided to the chamber, where the oxidant has a source flow rate. Water is provided to the chamber, where the water has a source temperature. By alternating precursor pulses, the water and the oxidant are integrated with purges of the chamber to provide low contamination levels and high growth rates of oxide material on the substrate, where the pulses and the purge have durations and flow rates. A repeatable growth cycle includes pulsing the precursor, purging the chamber, pulsing the water, pulsing the oxidant, and purging the chamber.

21 Claims, 3 Drawing Sheets

ATOMIC LAYER DEPOSITION OF STRONTIUM OXIDE VIA N-PROPYLTETRAMETHYL CYCLOPENTADIENDYL PRECURSOR

CROSS-REFERENCE TO RELATED APPLICATIONS

This application is cross-referenced to and claims the benefit from U.S. Provisional Patent Application 60/901,741 filed Feb. 15, 2007, which is hereby incorporated by reference.

FIELD OF THE INVENTION

The invention relates generally to deposition methods. More particularly, the invention relates to a method of efficiently depositing oxide layers with low contamination levels and high growth rates.

BACKGROUND

Use of suitable precursors in ALD processes is currently the topic of much research, where the selection of a proper precursor affects the purity and growth rate of a deposited layer. For example, Fluorine-containing precursors, though they have higher vapor pressures, are not desirable because strong ligand-M bonds result in low growth rates, and weak bonds in the ligand result in probable F contamination in the grown films. The most commonly used Sr precursor is the β-diketonate precursor $Sr(tmhd)_2$ (tmhd=2,2,6,6-tetramethyl-3,5-heptanedione), also referred to as dipivaloylmethane (DPM). ALD of Sr with tmhd precursors often leads to films with significant carbon contamination or formation of the $SrCO_3$ phase. Diketonates have stronger bonds to metal atoms than cyclopentadienyl rings and weaker bonds within the ligand, suggesting that diketonate precursors will have lower growth rates and more likely carbon contamination in the film. Literature suggests that the most thermally stable and volatile Ba precursors are Cp precursors with tert-Butyl and i-Propyl ligands. It has been reported that the vapor pressure stability of $Ba(tmhd)_2$ is low at typical growth temperatures, and it has been found that Sr and $Ba(tmhd)_2$ precursors decompose in the gas phase at substrate temperatures 300° C., whereas Sr or Ba atoms are incorporated into films at substrate temperatures of $\geq 400°$ C. Precursor thermal decomposition suggests that the precursor will not be suited to ALD, as self-limiting reaction cannot be achieved.

Accordingly, there is a need to develop a method of deposition of strontium oxide materials that reduces contamination yet enhances film growth rate.

SUMMARY OF THE INVENTION

The current invention provides a method of depositing oxide materials on a substrate having a substrate temperature by providing a deposition chamber holding the substrate, where the chamber has a chamber pressure and a chamber wall temperature. A precursor molecule containing a cation of the oxide material is provided to the chamber, where the precursor has a precursor line temperature and a precursor source temperature. An oxidant is provided to the chamber, where the oxidant has an oxidant source flow rate. Water is provided to the chamber, where the water has a water source temperature. By alternating pulses of the precursor, the water and the oxidant are integrated with purges of the chamber to provide low contamination levels and high growth rates of oxide material on the substrate, where the pulses and the purge have durations and flow rates.

According to one aspect of the invention, the deposited oxide material may be $SrO$, $SrO_2$, $SrCO_3$ or $SrOH$.

In another aspect, the substrate can be an oxide-surface substrate, semiconducting substrates, a metal having a thin oxide layer, substrates having a surface layer terminated in oxygen, hydrogen, hydroxyl groups, or a substrate with a non-oxide surface, where the semiconducting substrate is Si(100).

In another aspect of the invention, the substrate temperature can be between 150 to 350 degrees Celsius.

According to another aspect of the invention, the chamber pressure is between 0.01 and 10 torr.

In a further aspect, the chamber wall temperature is between the source temperature and the substrate temperature.

In another aspect, the precursor molecule may be Bis(n-propyltetramethyl cyclopentadienyl)Strontium, $(n-PrMe_4Cp)_2Sr$, $(n-PrMe_4Cp)_nM$, $Pr_xMe_{5-x}Cp)_nM$, $(i-Pr_xMe_{5-x}Cp)_nM$ or $(c-Pr_xMe_{5-x}Cp)_nM$, where x=1, 2, 3, 4, 5, and where M is any metal.

In an additional aspect of the invention, the precursor line temperature is between the source temperature and the substrate temperature.

In yet another aspect, the precursor source temperature is between 50 and 200 degrees Celsius.

In a further aspect of the invention, the oxidant can be oxygen, oxygen plasma, ozone, deionized water, purified water, or distilled water. According to another aspect, the oxidant source flow rate is between 1-1000 standard cubic centimeters per minute.

In an additional aspect, the water source temperature is greater than 10 degrees Celsius. In a further aspect, the precursor pulse has a pulse duration that is greater than 0.01 seconds.

In one aspect of the invention, the oxidant pulse duration has a pulse duration that is greater than 0.01 seconds.

According to a further aspect of the invention, the water pulse duration has a pulse duration that is greater than 0.01 seconds.

In yet another aspect, the purge duration between the pulses is as low as 0 seconds.

According to one aspect of the invention, the deposition has a growth cycle that includes pulsing the precursor, where the precursor pulse has a pulse duration of about 0.2 seconds. The growth cycle also includes purging the chamber, where the purge has a duration between 0 to 60 seconds, pulsing the water, where the water pulse has a duration of between 0 to 4 seconds, pulsing the oxidant, where the oxidant pulse has a duration between 0 to 10 seconds, and purging the chamber, where the purge has a duration between 0 to 90 seconds. Accordingly, the growth cycle may be repeated one or more times.

In a further aspect, the deposition method can be atomic layer deposition, chemical vapor deposition (CVD), metal organic chemical vapor deposition (MOCVD), molecular beam epitaxy (MBE), Aerosol assisted CVD, plasma enhanced CVD, low pressure CVD, or atmospheric pressure CVD.

In one embodiment of the invention, the method includes mixing an adduct with the precursor, where the adduct improves volatility of the precursor. According to one aspect of the current embodiment the adduct can be $(n-PrMe_4Cp)_2$ $Sr.CH_3OCH_2CH_2OCH_3$, tetrahydrofuran, tetrahydropyran, diethyl ether, dimethoxymethane, diethoxymethane, dipropoxymethane, 1,2-dimethoxyethane, 1,2-diethoxyethane, 1,2-dipropoxyethane, 1,3-dimethoxypropane; 1,3-diethoxypropane, 1,3-dipropoxypropane, 1,2-dimethoxybenzene, and 1,2-diethoxybenzene and/or 1,2-dipropoxybenzene.

The current invention has several key advantages over current methods. These advantages include: rapid deposition by the above precursors and above deposition parameters; low contamination by the above precursors and above deposition parameters; growth of oxide phase (SrO rather than $SrCO_3$) by the above precursors with given deposition parameters; lowered operating temperature of the system due to higher volatility and more favorable reactions with the above precursors; and lower cost by increasing the film purity and growth rate.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

Experimental observations of C and F contamination in films grown with diketonate precursors are explained by the weak bonds within the ligand. Isotope exchange experiments showing that O content in the film comes from the gas phase rather than the ligand are supported by the inventor's finding that the Sr—O bond is weaker than the O—C bond in the diketonate ligand. Deposition with the $Me_5$ Cp precursor and others has been accomplished at reasonable temperatures of sublimation with growth rates of 0.4 Å/cycle and low carbon contamination in the bulk. Growth rates with different oxygen sources increased in the order $O_2<H_2O<O_2+H_2O$. On the basis of the preceding bond strength analysis and available experimental evidence, the $PrMe_4Cp$ and $Me_5Cp$ precursors represent the best precursors for Sr and Ba film growth via ALD or CVD.

Figure 1:
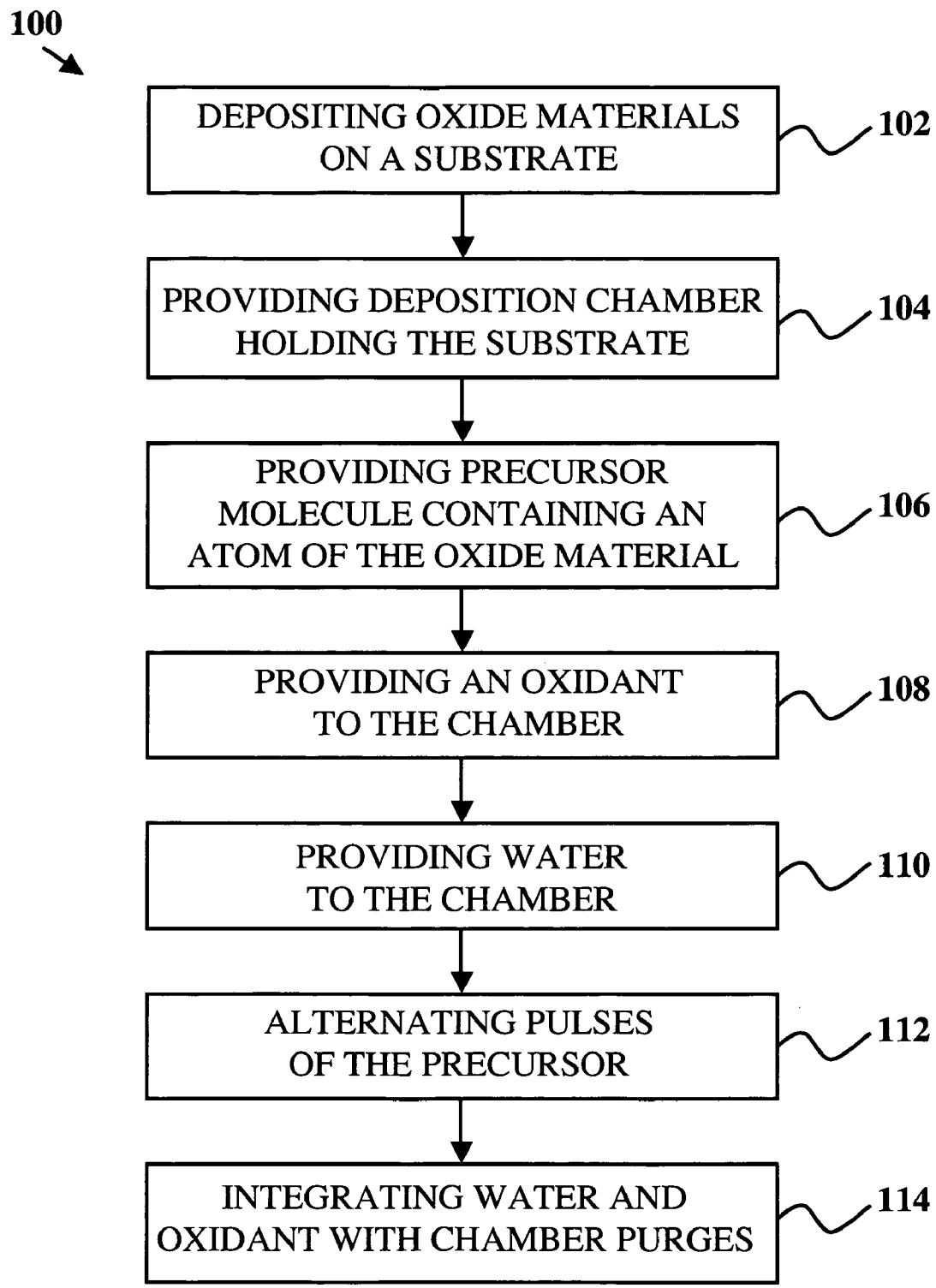
FIG. 1 shows a flow diagram of the oxide material deposition method according to the present invention.

FIG. 1 shows a flow diagram of the oxide material deposition method 100. The method includes the step of depositing oxide materials on a substrate 102 having a substrate temperature, and by providing a deposition chamber 104 holding the substrate, where the chamber has a chamber pressure and a chamber wall temperature. A precursor molecule containing an atom of the oxide material is provided 106 to the chamber, where the precursor has a precursor line temperature and a precursor source temperature. An oxidant is provided 108 to the chamber, where the oxidant has an oxidant source flow rate. Water is provided 110 to the chamber, where the water has a water source temperature. By alternating pulses of the precursor 112, the water and the oxidant are integrated with purges of the chamber 114 to provide low contamination levels and high growth rates of oxide material on the substrate, where the pulses and the purge have durations and flow rates.

The invention can be varied or modified in several different ways without departing from the scope of the invention. For example, the precursor may include an adduct of a different chemical to increase volatility. Alternatively, application of the precursor to chemical vapor deposition techniques does not limited to the method to ALD. The use of only water or only oxygen as oxidant can be an effective variation, in addition to variation of processing parameters including pressure, temperature, flow rate, and the substrate. Expanding the precursor selection to include $(n-PrMe_4Cp)_nM$ where M is any metal can provide useful oxide layers.

The invention includes deposited oxide materials such as SrO, $SrO_2$, $SrCO_3$ or SrOH, and the substrate can be an oxide-surface substrate, semiconducting substrates, a metal having a thin oxide layer, substrates having a surface layer terminated in oxygen, hydrogen, hydroxyl groups, or a substrate with a non-oxide surface, where the semiconducting substrate is Si(100).

Figure 2:
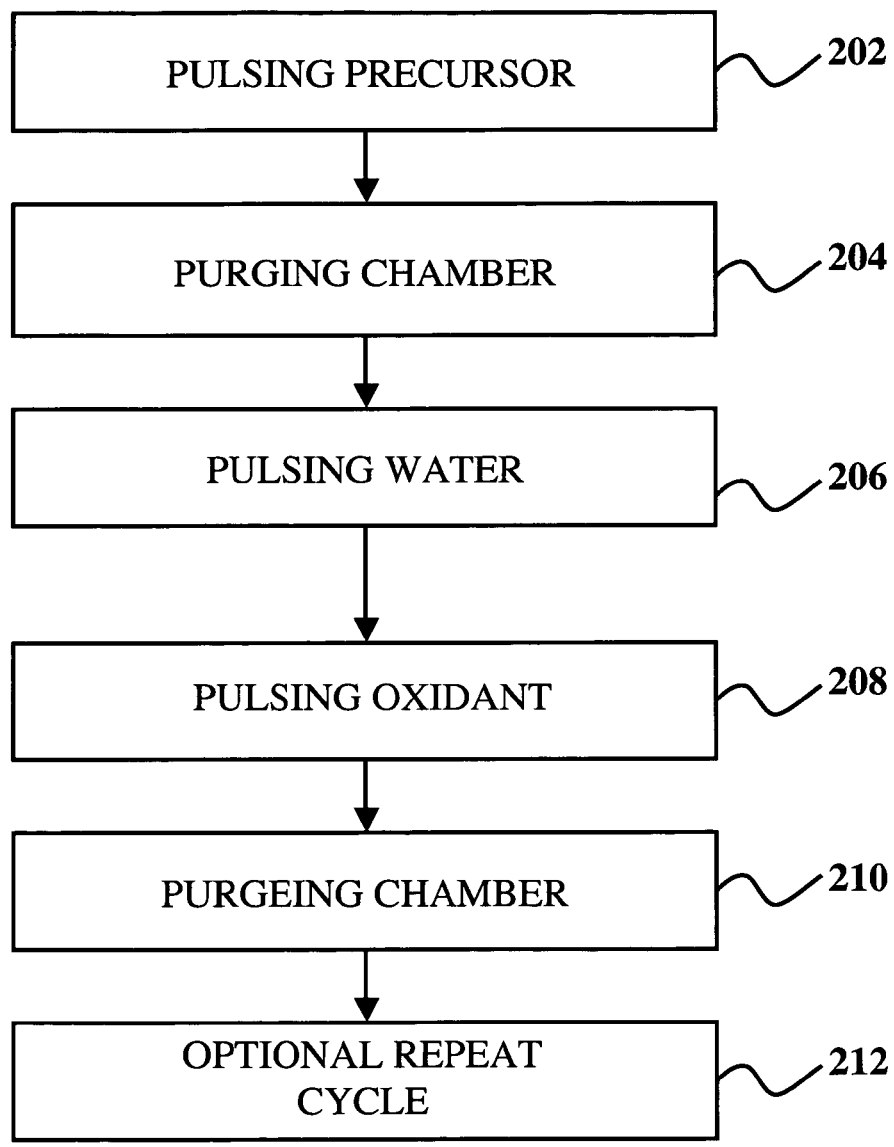
FIG. 2 shows the steps of a deposition growth cycle according to the present invention.

FIG. 2 shows the steps of a deposition growth cycle 200 that includes pulsing the precursor 202, where the precursor pulse has a pulse duration of about 0.2 seconds. The growth cycle also includes purging the chamber 204, where the purge has a duration between 0 to 60 seconds. The water is pulsed 206, where the water pulse has a duration between 0 to 4 seconds. The oxidant may be pulsed 208, where the oxidant pulse can have a pulse duration between 0 to 10 seconds. The chamber is purged 210, where the purge has a purge duration between 0 to 90 seconds. Accordingly, the growth cycle may be repeated 212 one or more times.

Application of the precursor to chemical vapor deposition techniques is not limited to ALD, where the deposition method can be atomic layer deposition, chemical vapor deposition (CVD), metal organic chemical vapor deposition (MOCVD), molecular beam epitaxy (MBE), Aerosol assisted CVD, plasma enhanced CVD, low pressure CVD, or atmospheric pressure CVD.

In one embodiment of the invention, the method includes mixing an adduct with the precursor, where the adduct improves volatility of the precursor. According to one aspect of the current embodiment the adduct can be $(n-PrMe_4Cp)_2$ $Sr.CH_3OCH_2CH_2OCH_3$, tetrahydrofuran, tetrahydropyran, diethyl ether, dimethoxymethane, diethoxymethane, dipropoxymethane, 1,2-dimethoxyethane, 1,2-diethoxyethane, 1,2-dipropoxyethane, 1,3-dimethoxypropane; 1,3-diethoxypropane, 1,3-dipropoxypropane, 1,2-dimethoxybenzene, and 1,2-diethoxybenzene and/or 1,2-dipropoxybenzene.

Other variations in the method(s) above are, for example a substrate with a non-oxide surface, no chamber purge, varied pulse/purge/pump times, growth with other oxidants, e.g. oxygen plasma, ozone, only $O_2$, only water, and chamber purge between water and oxygen pulse.

In one example of the deposition of an oxide film, ALD of SrO films was performed on Si (100) substrates in a commercial reactor (Cambridge Nanotech Savannah 200) with $Sr(PrMe_4Cp)_2$ dimethoxyethane (Alfa Aesar J27Q052) and $Sr(tmhd)_2$ (Strem B1950041).

The oxygen sources were oxygen (Praxair 99.993%), ozone (ozone generator MKS AX8560) and deionized water. The source temperature was varied from 50-200° C., the substrate temperature was varied from 150-350° C. The lines and valves leading from the source to the reactor were heated to a temperature between the source and substrate temperature, as were the reactor walls. Typical ozone or oxygen pulse times were 4 sec., typical water pulse times were 0.5 sec., and typical precursor pulse times were 0.2 sec. The purge time between pulses was 10-15 sec. An oxygen flow rate of 0.5 slm was maintained by a mass flow controller. Films were characterized by ellipsometry, x-ray photoemission spectroscopy (XPS), x-ray diffraction (XRD), and scanning electron microscopy (SEM). Depth profiling with XPS was done by sputtering with Ar ions at 3 kV, 10 mA, $1\times10^{-7}$ torr given a sputtering rate of approximately 1 Å/sec.

Figure 3:
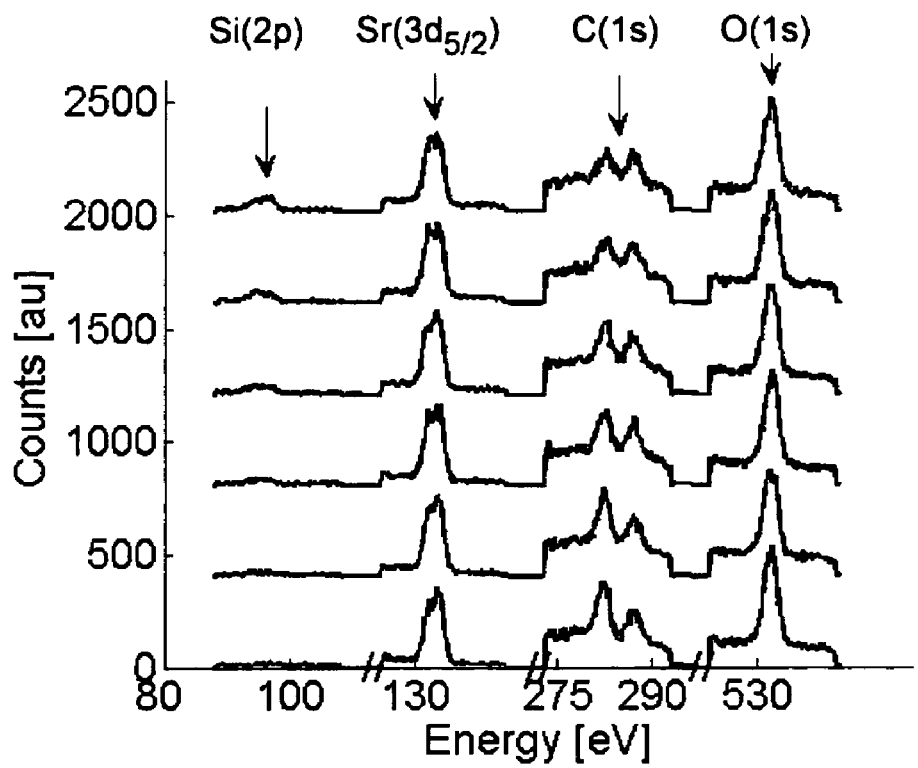
FIG. 3 shows x-ray photoemission spectroscopy depth profile of SrO grown on a Si substrate with water and $Sr(PrMe_4Cp)_2$ according to the present invention.

Growth of SrO with $Sr(PrMe_4Cp)_2$ was observed in an ALD window of 250-350° C. and source temperatures 190-200° C. with oxygen and water as oxidants. Growth rates with oxygen were approximately 0.07 Å/cycle, independent of substrate temperature within the ALD window. Growth rates with water were approximately 0.2 Å/cycle, also independent of substrate temperature in the window. Depth profiling with XPS showed C contamination throughout the film grown with water. FIG. 3 shows XPS depth profile of SrO grown on a Si substrate with water and $Sr(PrMe_4Cp)_2$. The Si signal is due to substrate. Measurements after 2 nm sputtering are offset along the y-axis for clarity. Note broken x-axis.

Figure 4:
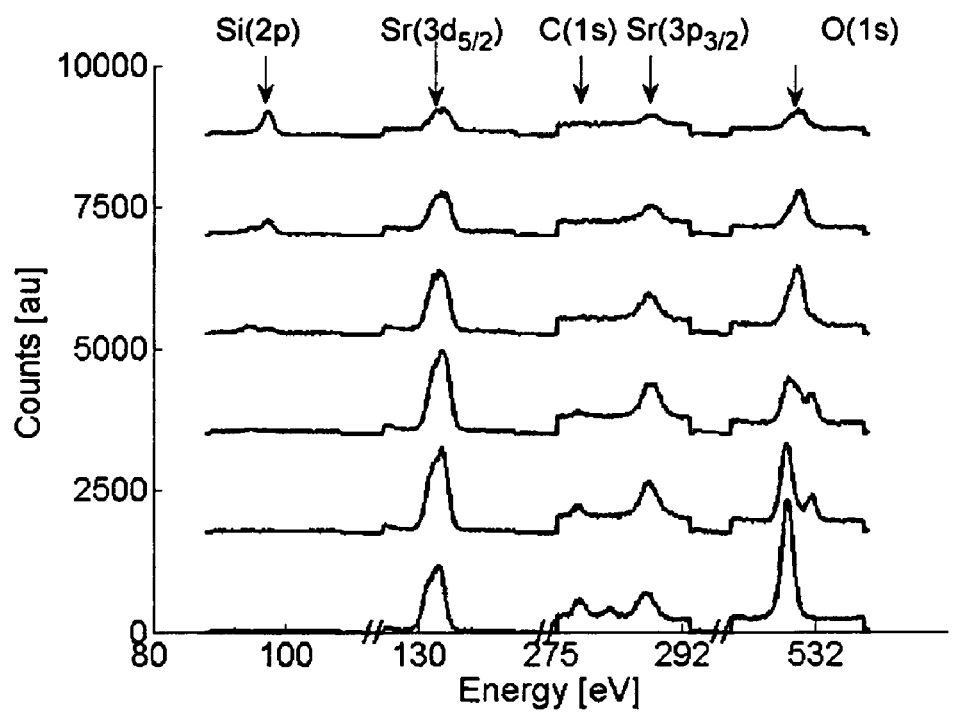
FIG. 4 shows x-ray photoemission spectroscopy depth profile of SrO grown on a Si substrate with water, oxygen, and Sr(PrMe4Cp)$_2$ according to the present invention.

Growth with pulses of both water and oxygen between Sr precursor pulses was completed. Using both oxygen and water, films grew at growth rates of 0.4 Å/cycle. Carbon contamination in the bulk was diminished. FIG. 4 shows XPS depth profile of SrO grown on a Si substrate with water, oxygen, and Sr(PrMe4Cp)$_2$. The Si signal is from substrate. Measurements after 1 nm material sputtered away are offset along the y-axis for clarity. Note broken x-axis.

An ideal precursor has a relatively weak bond between the metal atom and the ligand. To further weaken the bond between M and the ligand, the ligand should donate charge to antibonding orbitals between M and the ligand. When substituted for methyl groups in β-diketonates, the strongly electronegative F draws charge density toward itself, removing charge from antibonding orbitals, and strengthening the M-ligand bond. Therefore, fluorinated precursors sacrifice ease of reaction, and therefore growth rate, for greater volatility. Further, some have noted F contamination in films grown with hfac precursors. Therefore, it is understood that hfac and fod are not preferred precursors for Sr and Ba film growth. The strong tmhd-Sr bonds explain why reaction with water or oxygen does not occur at temperatures below their thermal decomposition temperature, and therefore require the much more reactive ozone to be used as the oxygen source.

Cyclopentadienyl precursors have much weaker bonds to Sr and Ba than β-diketonates. When electron donating methyl groups are substituted for hydrogen on the Cp ring, the bond is further weakened. It the inventors aver that substituting longer carbon chains for methyl groups does not greatly affect the bond strength between M and the ligand. Further, the weakest bond in tmhd precursors is that between the $C(CH_3)_3$ end group and the rest of the ligand. This group is less weakly bound than the metal atom, thus this bond is the most likely site for reaction or decomposition. If the $C(CH_3)_3$ group is broken, the radical could react with Sr—O bonds in the growing film, thus describing a likely route for carbon incorporation into the film. If the group reacts with ozone in the gas phase, it may be further broken down or passivated.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, variation of process parameters include, the substrate temperature, which can be between 150 to 350 degrees Celsius, the chamber pressure can be between 0.01 and 10 torr, the chamber wall temperature can be between the source temperature and the substrate temperature. Additionally, the precursor molecule is may be Bis(n-propyltetramethyl cyclopentadienyl)Strontium, $(n-PrMe_4Cp)_2Sr$, $(n-PrMe_4Cp)_nM$, $Pr_xMe_{5-x}Cp)_nM$, $(i-Pr_xMe_{5-x}Cp)_nM$ or $(c-Pr_xMe_{5-x}Cp)_nM$, where x=1, 2, 3, 4, 5, and where M is any meta, while the precursor line temperature is between the source temperature and the substrate temperature. The precursor source temperature can be varied between 50 and 200 degrees Celsius, and the oxidant can be oxygen, oxygen plasma, ozone, deionized water, purified water, or distilled water, where the oxidant source flow rate can be between 1-1000 standard cubic centimeters per minute (sccm). Another useful process variation is with the water source temperature being greater than 10 degrees Celsius. The precursor pulse can have a pulse duration that is greater than 0.01 seconds, and the oxidant pulse duration can have a pulse duration that is greater than 0.01 seconds, while the water pulse duration can have a pulse duration that is greater than 0.01 seconds. Another useful variation is the purge duration between the pulses that can be as low as 0 seconds.

All such variations are considered to be within the scope and spirit of the present invention as defined by the following claims and their legal equivalents.

What is claimed:

1. A method of deposition of oxide materials comprising:
   a. providing a substrate, wherein said substrate has a substrate temperature;
   b. providing a deposition chamber holding said substrate, wherein said chamber has a chamber pressure and a chamber wall temperature;
   c. providing a precursor molecule containing an atom of said oxide material to said chamber, wherein said precursor has a precursor line temperature and a precursor source temperature;
   d. providing an oxidant to said chamber, wherein said oxidant has an oxidant source flow rate; and
   e. providing water to said chamber, wherein said water has a water source temperature; whereby alternating pulses of said precursor, said water and said oxidant are integrated with purges of said chamber to provide low contamination levels and high growth rates of oxide material on said substrate, whereas said pulses and said purge comprise durations and flow rates.

2. The method of claim 1, wherein said deposited oxide material is selected from a group consisting of SrO, $SrO_2$, $SrCO_3$ and SrOH.

3. The method of claim 1, wherein said substrate is selected from a group consisting of an oxide-surface substrate, semiconducting substrates, a metal having a thin oxide layer, substrates having a surface layer terminated in oxygen, hydrogen, hydroxyl groups, and a substrate with a non-oxide surface.

4. The method of claim 3, wherein said semiconducting substrate comprises Si(100).

5. The method of claim 1, wherein said substrate temperature is between 150 to 350 degrees Celsius.

6. The method of claim 1, wherein said chamber pressure is between 0.01 and 10 torr.

7. The method of claim 1, wherein said chamber wall temperature is between said source temperature and said substrate temperature.

8. The method of claim 1, wherein said precursor molecule is selected from a group consisting of Bis(n-propyltetramethyl cyclopentadienyl)Strontium, $(n-PrMe_4Cp)_2Sr$, (n-PrMe$_4$Cp)$_n$M, Pr$_x$Me$_{5-x}$Cp)$_n$M, (i-Pr$_x$Me$_{5-x}$Cp)$_n$M, and (c-Pr$_x$Me$_{5-x}$Cp)$_n$M, whereas x=1, 2, 3, 4, 5, whereby M is any metal.

9. The method of claim 1, wherein said precursor line temperature is between said source temperature and said substrate temperature.

10. The method of claim 1, wherein said precursor source temperature is between 50 and 200 degrees Celsius.

11. The method of claim 1, wherein said oxidant is selected from a group consisting of oxygen, oxygen plasma, ozone, deionized water, purified water, and distilled water.

12. The method of claim 1, wherein said oxidant source flow rate is between 1-1000 standard cubic centimeters per minute.

13. The method of claim 1, wherein said water source temperature is greater than 10 degrees Celsius.

14. The method of claim 1, wherein said precursor pulse has a pulse duration that is greater than 0.01 seconds.

15. The method of claim 1, wherein said oxidant pulse duration has a pulse duration that is greater than 0.01 seconds.

16. The method of claim 1, wherein said water pulse duration has a pulse duration that is greater than 0.01 seconds.

17. The method of claim 1, wherein said purge duration between said pulses is as low as 0 seconds.

18. The method of claim 1, wherein said deposition comprises a growth cycle comprising:
   a. pulsing said precursor, wherein said precursor pulse has a duration of about 0.2 seconds;
   b. purging said chamber, wherein said purge has a duration between 0 to 60 seconds;
   c. pulsing said water, wherein said water pulse has a duration of between 0 to 4 seconds;
   d. pulsing said oxidant, wherein said oxidant pulse has a duration between 0 to 10 seconds; and
   e. purging said chamber, wherein said purge has a duration between 0 to 90 seconds, wherein said growth cycle may be repeated one or more times.

19. The method of claim 1, wherein said deposition method is selected from a group consisting of atomic layer deposition, chemical vapor deposition (CVD), metal organic chemical vapor deposition (MOCVD), molecular beam epitaxy (MBE), Aerosol assisted CVD, plasma enhanced CVD, low pressure CVD, and atmospheric pressure CVD.

20. The method of claim 1 further comprises mixing an adduct with said precursor, wherein said adduct improves volatility of said precursor.

21. The method of claim 20, wherein said adduct is selected from a group consisting of (n-PrMe$_4$Cp)$_2$Sr.CH$_3$OCH$_2$CH$_2$OCH$_3$, tetrahydrofuran, tetrahydropyran, diethyl ether, dimethoxymethane, diethoxymethane, dipropoxymethane, 1,2-dimethoxyethane, 1,2-diethoxyethane, 1,2-dipropoxyethane, 1,3-dimethoxypropane; 1,3-diethoxypropane, 1,3-dipropoxypropane, 1,2-dimethoxybenzene, and 1,2-diethoxybenzene and/or 1,2-dipropoxybenzene.

* * * * *